US007710729B2

(12) United States Patent
Li et al.

(10) Patent No.: US 7,710,729 B2
(45) Date of Patent: May 4, 2010

(54) METHOD AND SYSTEM OF REAL-TIME ESTIMATION OF TRANSMISSION LINE PARAMETERS IN ON-LINE POWER FLOW CALCULATIONS

(75) Inventors: Wenyuan Li, Burnaby (CA); Paul Choudhury, Coquitlam (CA); Jun Sun, Burnaby (CA)

(73) Assignee: British Columbia Transmission Corporation, Vancouver, BC (CA)

( * ) Notice: Subject to any disclaimer, the term of this patent is extended or adjusted under 35 U.S.C. 154(b) by 139 days.

(21) Appl. No.: 11/904,154

(22) Filed: Sep. 25, 2007

(65) Prior Publication Data
US 2009/0027066 A1  Jan. 29, 2009

Related U.S. Application Data

(60) Provisional application No. 60/952,494, filed on Jul. 27, 2007.

(51) Int. Cl.
*H05K 7/20* (2006.01)
(52) U.S. Cl. .................................. 361/720; 361/760
(58) Field of Classification Search ................ 361/760, 361/720, 736, 748, 103, 93–94; 711/100, 711/117, 121, 141, 144; 324/617, 650
See application file for complete search history.

(56) References Cited

U.S. PATENT DOCUMENTS 6,713,998 B2* 3/2004 Stanimirov et al. ..... 324/117 R

| | | | |
|---|---|---|---|
| 6,933,714 B2* | 8/2005 | Fasshauer et al. | 324/76.21 |
| 7,164,275 B2* | 1/2007 | Gasperi | 324/652 |
| 7,248,977 B2* | 7/2007 | Hart | 702/62 |

OTHER PUBLICATIONS

Eastern Interconnection Phasor Project, IEEE, (2006) 336-342.
Hong, Young-Huei et al., "Fast Calculation of a Voltage Stability Index of Power Systems", IEEE Transactions on Power Systems, vol. 12, No. 4 (Nov. 1997), 1555-1560.
Kessel, P. et al., "Estimating the Voltage Stability of a Power System", IEEE Transactions on Power Delivery, vol. PWRD-1, No. 3 (Jul. 1986), 346-354.
Moghavvemi, Mahmoud et al., "New Method for Indicating Voltage Stability Condition in Power System", Supplied by the British Library, 223-227.
Moghavvemi, Mahmoud et al., "Power system security and voltage collapse: a line outage based indicator for prediction", Electrical Power and Energy Systems 21 (1999) 455-461.
Phadke, A.G., "Synchronized Phasor Measurements in Power Systems", IEEE Computer Applications in Power (Apr. 1993), 10-15.
Smon, Ivan et al., "Local Voltage-Stability Index Using Tellegen's Theorem", IEEE Transactions on Power Systems, vol. 21, No. 3 (Aug. 2006), 1267-1275.

(Continued)

*Primary Examiner*—Hung S Bui
(74) *Attorney, Agent, or Firm*—Nixon Peabody LLP

(57) ABSTRACT

A system and method for estimating parameters of transmission lines employing phasor measurement units is provided, wherein measurements are provided from the phasor measurement units relating to a transmission line. These measurements are filtered to remove invalid measurements. Using the remaining valid measurements, resistance, reactance and grounding admittance are calculated and estimated and checked for errors.

16 Claims, 2 Drawing Sheets

OTHER PUBLICATIONS

Venkatesh, B. et al., "Optimal Reconfiguration of Radial Distribution Systems to Maximize Loadability", IEEE Transactions on Power Systems, vol. 19, No. 1 (Feb. 2004), 260-266.

Vu, Khoi et al., "Use of Local Measurements to Estimate Voltage-Stability Margin", IEEE Transactions on Power Systems, vol. 14, No. 3 (Aug. 1999), 1029-1035.

Xie, Xiaorong et al., "WAMS Applications in Chinese Power Systems", IEEE Power & Energy Magazine (Jan./ Feb. 2006), 54-63.

Zima, Marek et al., "Design Aspects for Wide-Area Monitoring and Control Systems", Proceedings of the IEEE, vol. 93, No. 5 (May 2005), 980-996.

* cited by examiner

METHOD AND SYSTEM OF REAL-TIME ESTIMATION OF TRANSMISSION LINE PARAMETERS IN ON-LINE POWER FLOW CALCULATIONS

CROSS REFERENCE TO RELATED APPLICATIONS

This application is related to the following:

This application claims the benefit of Canadian Patent Application No. 2602888, filed Sep. 18, 2007, and claims priority of U.S. Provisional Patent Application No. 60/952,494, filed Jul. 27, 2007 which is hereby incorporated by reference.

FIELD OF THE INVENTION

This invention relates to methods of estimating transmission line parameters in power systems and more particularly to methods of using such estimations in real time power flow calculations.

BACKGROUND OF THE INVENTION

High voltage transmission line parameters include resistance, reactance, and equivalent admittance which represent reactive charging power along the line. These parameters are a necessary and important input in power system modeling, power flow computations, voltage stability assessment, line protection design and other applications. In the prior art, the transmission line parameters are calculated using theoretically derived formulas based on information of the line's size, length, structure and type, etc., which are assumed to be constant during the power flow modeling. However, there is a difference between the calculated and actual parameters. Some prior art methods have been developed to measure the resistance and reactance of a line. However, the equivalent admittance representing reactive charging power is not measurable. Also, a "snapshot" off-line measurement of resistance and reactance parameters is not sufficient for on-line and real time applications, because in a real live environment, resistance, reactance and equivalent admittance of lines vary with environment and weather (such as temperature and wind speed). Therefore, the assumption of constant parameters may create unacceptable error, particularly when the environment or weather around the line has a relatively large change.

U.S. Pat. No. 5,631,569, entitled "Impedance measurement in a high-voltage power system" discloses a power monitoring instrument for evaluating and displaying the source impedance, load impedance, and distribution system impedance. The focus of this patent is placed on sources, loads and distribution systems but not on transmission line parameters. U.S. Pat. No. 5,818,245, entitled "Impedance measuring", discloses a measurement method for impedance of a power system adapted for operation at a predetermined line frequency. This patent focuses on the effect of frequency on the measurement and requires a testing signal of frequency. U.S. Pat. No. 6,397,156, entitled "Impedance measurement system for power system transmission lines" discloses an impedance measurement method to improve various protection functions. All of the above methods are not designed for an application operating in real time or for on-line power flow modeling and calculations, and also cannot provide an estimation of equivalent admittance representing reactive charging power of a transmission line.

PMU technology has developed quickly in the utility industry of both developed and developing countries in recent years since the basic concept was presented, as described in A. G. Phadke, "Synchronized Phasor Measurements in Power Systems", IEEE Computer Applications in Power, April 1993, pp 10-15; M. Zima, M. Larsson, P. Korba, C. Rehtanz and G. Anderson, "Design aspects for wide-area monitoring and control systems", Proceedings of IEEE, Vol. 93, No. 5, May, 2005, pp 980-996; "Eastern Interconnection Phasor Project", 2006 IEEE PES Power Systems Conference and Exposition, 2006 (PSCE '06), Oct. 29-Nov. 1, 2006, pp 336-342; and Xiaorong Xie, Yaozhong Xin, Jinyu Xiao, Jingto Wu and Yingduo Han, "WAMS applications in Chinese power systems," IEEE Power & Energy magazine, Vol. 4, No. 1, January/February 2006 pp 54-63. The application of PMU is currently limited to phasor monitoring, enhancement of system state estimator and protection relays as disclosed in U.S. Pat. No. 684,533, entitled "Protective relay with synchronized phasor measurement capability for use in electric power systems" and U.S. Pat. No. 7,069,159, entitled "Electric power transmission network state estimation".

SUMMARY OF THE INVENTION

The system and method according to the invention discloses a method for real time estimation of transmission line parameters for on-line power flow modeling or for similar calculations in power system applications. The basic features of the system and method include:

The method uses synchronized phasor measurement units (PMU);

Invalid PMU measurements (false or erroneous information) are filtered and only reliable PMU measurements are used, thereby increasing reliability and accuracy of an estimation;

The estimation can be performed very quickly and be applied in a real time application environment; and The method is based on the fact that line parameters change with time and can be therefore used to enhance accuracy of state estimation and power flows in the Energy Management System (EMS) at utility control centers, which are performed every a few minutes. The method can be also used for other applications that use power flow information, such as real time identification of voltage stability.

The method according to the invention is based on the use of synchronized phasor measurement. The method according to the invention promotes the application of PMUs in real time estimation of transmission line parameters and on-line power flow calculations.

A method of filtering invalid measurements is provided, including the steps of: (a) receiving measurements from a first phasor measurement unit at a sending bus of a transmission line, and a second phasor measurement unit at a receiving bus j of the transmission line; (b) calculating charging reactive powers at the sending bus and the receiving bus; a reactive power flow excluding charging reactive power at the sending bus, a reactive power flow excluding charging reactive power at the receiving bus, and a reactive power loss of the line, using the measurements; (c) calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at the sending bus, $V_j$ is a voltage magnitude at the receiving bus, $Q_i$, is a reactive power flow including charging reactive power at the sending bus, and $Q_{ij}$ is a reactive power flow including charging reactive power at the receiving buses; and $\Delta Q$ is a loss of the transmission line; (d) using said grounding admittance Y(new) to recalculate the charging reactive power at the receiving bus, and the reactive power flow excluding charging reactive power at the receiving bus; (e) calculating a resistance $R_{ij}$ and a reactance $X_{ij}$ using the following equation:

$$R_{ij}(new) = \frac{aP_{ij} + bQ^*_{ij}}{P^2_{ij} + (Q^*_{ij})^2} \text{ and } X_{ij}(new) = \frac{aQ^*_{ij} - bP_{ij}}{P^2_{ij} + (Q^*_{ij})^2}$$

wherein $P_{ij}$ is a real power flow at the receiving bus, $Q^*_{ij}$ is a reactive power flow excluding the charging reactive power at the receiving bus; and a and b are calculated using the following equations:

$$-V_j^2 + V_iV_j \cos\theta_{ji} = a \text{ and}$$

$$V_iV_j \sin\theta_{ji} = b$$

wherein $\theta_{ji} = \theta_j - \theta_i$ wherein $\theta_i$ is a voltage angle at the sending bus and $\theta_j$ is a voltage angle at the receiving bus.

The method may further include calculating an error for each of said resistance, said reactance and said grounding admittance, and if said error for either said resistance, or said reactance or said grounding admittance, is larger than a predetermined threshold, discarding said measurements. Also, the measurements from the first and second phasor measurement units may include the voltage magnitude $V_i$ at the sending bus, the voltage magnitude $V_j$ at the receiving bus, the voltage angle $\theta_i$ at the sending bus and the voltage angle $\theta_j$ at the receiving bus; a line power flow $P_{ij} + Q_{ij}$ including a charging reactive power at the receiving bus; and a line power flow $P_i + jQ_i$ including a charging reactive power at the sending bus.

The threshold may be determined using a precision factor associated with the measurements, an error transfer relationship factor between the measurements and the resistance, the reactance and the grounding admittance, and an estimate of possible small change of the resistance, the reactance and the grounding admittance in a short time interval.

A system for filtering invalid measurements is provided, including a first phasor measurement unit at a sending bus i of a transmission line and a second phasor measurement unit at a receiving bus j of the transmission line, the first and second phasor measurement units providing measurements associated with the transmission line; a computer calculating: charging reactive powers at the sending bus and the receiving bus; a reactive power flow excluding charging reactive power at the sending bus, a reactive power flow excluding charging reactive power at the receiving bus, and a reactive power loss of the line, using the measurements; and calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at the sending bus, $V_j$ is a voltage magnitude at the receiving bus, $Q_i$, is a reactive power flow including charging reactive power at the sending bus, and $Q_{ij}$ is a reactive power flow including charging reactive power at the receiving bus; and $\Delta Q$ is a loss of power of the transmission line; and using the grounding admittance Y(new) to recalculate the charging reactive power at the receiving bus, and the reactive power flow excluding charging reactive power at the receiving bus; and calculating a resistance $R_{ij}$ and a reactance $X_{ij}$ using the following equation:

$$R_{ij}(new) = \frac{aP_{ij} + bQ^*_{ij}}{P^2_{ij} + (Q^*_{ij})^2} \text{ and } X_{ij}(new) = \frac{aQ^*_{ij} - bP_{ij}}{P^2_{ij} + (Q^*_{ij})^2}$$

wherein $P_{ij}$ is a real power flow at the receiving bus, $Q^*_{ij}$ is a reactive power flow excluding the charging reactive power at the receiving bus; and a and b are calculated using the equations:

$$-V_j^2 + V_iV_j \cos\theta_{ji} = a \text{ and}$$

$$V_iV_j \sin\theta_{ji} = b$$

wherein $\theta_{ji} = \theta_j - \theta_i$ wherein $\theta_i$ is a voltage angle at the sending bus and $\theta_j$ is a voltage angle at the receiving bus.

The computer may further calculate an error for each of the resistance, the reactance and the grounding admittance, and if the error for either the resistance, or the reactance or the grounding admittance is larger than a predetermined threshold, the computer discards the measurements. The measurements from the first and second phasor measurement units may include the voltage magnitude $V_i$ at the sending bus, the voltage magnitude $V_j$ at the receiving bus, the voltage angle $\theta_i$ at the sending bus and the voltage angle $\theta_j$ at the receiving bus; a line power flow $P_{ij} + jQ_{ij}$ including a charging reactive power at the receiving bus; and a line power flow $P_i + jQ_i$, including a charging reactive power at the sending bus. The computer may further calculate the threshold using a precision factor associated with the measurements, an error transfer relationship factor between the measurements and the resistance, the reactance and the grounding admittance, and an estimate of possible small change of the resistance, the reactance and the grounding admittance in a short time interval.

A method of estimating line parameters using first and second phasor measurement units associated with a transmission line is provided, including the steps: (a) obtaining a plurality (M) sets of measurements from the phasor measurement units; (b) for each of the sets of measurements, calculating charging reactive powers at a sending bus i and a receiving bus j of the transmission line; a reactive power flow excluding charging reactive power at the sending bus, a reactive power flow excluding charging reactive power at the receiving bus, and a reactive power loss of the line, using the measurements; and calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at the sending bus, $V_j$ is a voltage magnitude at the receiving bus, $Q_i$, is a reactive power flow including charging reactive power at the sending bus, and $Q_{ij}$ is a reactive power flow including charging reactive power at the receiving bus; and $\Delta Q$ is a loss of power of the transmission line; and using the grounding admittance Y(new) to recalculate the charging reactive power at the receiving bus, and the reactive power flow excluding charging reactive power at the receiving bus; and calculating a resistance $R_{ij}$ and a reactance $X_{ij}$ using the following equation:

$$R_{ij}(new) = \frac{aP_{ij} + bQ_{ij}^*}{P_{ij}^2 + (Q_{ij}^*)^2} \text{ and } X_{ij}(new) = \frac{aQ_{ij}^* - bP_{ij}}{P_{ij}^2 + (Q_{ij}^*)^2}$$

wherein $P_{ij}$ is a real power flow at the receiving bus, $Q^*_{ij}$ is a reactive power flow excluding the charging reactive power at the receiving bus; and a and b are calculated using the following equations:

$$-V_j^2 + V_i V_j \cos\theta_{ji} = a$$

$$V_i V_j \sin\theta_{ji} = b$$

wherein $\theta_{ji} = \theta_j - \theta_i$ wherein $\theta_i$ is a voltage angle at the sending bus and $\theta_j$ is a voltage angle at the receiving bus;

(c) estimating a value of grounding admittance of the transmission line, using the equation:

$$Y(estim) = \frac{\sum_{k=1}^{M} Y_k(new)}{M}$$

wherein each of the $Y_k$(new) values is a previously calculated value of admittance;

(d) estimating a value of resistance of the line, using the equation:

$$R_{ij}(estim) = \frac{\sum_{k=1}^{M} R_{ijk}(new)}{M}$$

wherein each of said $R_{ikj}$(new) values is a previously calculated value of resistance;

(e) estimating a value of reactance of the line, using the equation:

$$X_{ij}(estim) = \frac{\sum_{k=1}^{M} X_{ijk}(new)}{M}$$

wherein each of the $X_{ijk}$(new) values is a previously calculated value of reactance; (f) calculating a sample standard deviation of the estimated resistance and a sample standard deviation of the estimated reactance; and (g) if the sample standard deviation of the estimated resistance or the sample standard deviation of the estimated reactance is greater than a predetermined threshold, then the computer re-estimating the resistance and the reactance using a least square method.

The measurements may be filtered to remove unreliable data prior to determining the estimated reactance, the estimated resistance and the estimated admittance. The number of reliable sets of measurements may be greater than nine. The least square method used to obtain a least squares solution of the resistance and the reactance using the $Y_k$(new) values, the $R_{ikj}$(new) values and the $X_{ijk}$(new) values may be the following equations:

$$R_{ij} + cX_{ij} = d$$

$$R_{ij} + eX_{ij} = f$$

wherein:

$$c = \frac{Q_{ij}^*}{P_{ij}}$$

$$d = \frac{-V_j^2 + V_i V_j \cos\theta_{ij}}{P_{ij}}$$

$$e = \frac{-P_{ij}}{Q_{ij}^*} \text{ and}$$

$$f = \frac{V_i V_j \sin\theta_{ij}}{Q_{ij}^*}$$

A system for estimating line parameters is provided, including: a transmission line; first and second phasor measurement units associated with the transmission line; and a computer receiving a plurality (M) sets of measurements from the phasor measurement units; and calculating charging reactive powers at a sending bus i and a receiving bus j of the transmission line; a reactive power flow excluding charging reactive power at the sending bus, a reactive power flow excluding charging reactive power at the receiving bus, and a reactive power loss of the line, using the measurements; and calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at the sending bus, $V_j$ is a voltage magnitude at the receiving bus, $Q_i$ is a reactive power flow including charging reactive power at the sending bus, and $Q_{ij}$ is a reactive power flow including charging reactive power at the receiving bus; and $\Delta Q$ is a loss of power of the transmission line; and using the grounding admittance Y(new) to recalculate the charging reactive power at the receiving bus, and the reactive power flow excluding charging reactive power at the receiving bus; and calculating a resistance $R_{ij}$ and a reactance $X_{ij}$ using the following equations:

$$R_{ij}(new) = \frac{aP_{ij} + bQ_{ij}^*}{P_{ij}^2 + (Q_{ij}^*)^2} \text{ and } X_{ij}(new) = \frac{aQ_{ij}^* - bP_{ij}}{P_{ij}^2 + (Q_{ij}^*)^2}$$

wherein $P_{ij}$ is a real power flow at the receiving bus, $Q^*_{ij}$ is a reactive power flow excluding the charging reactive power at the receiving bus; and a and b are calculated using the following equations:

$$-V_j^2 + V_i V_j \cos\theta_{ji} = a \text{ and}$$

$$V_i V_j \sin\theta_{ji} = b$$

wherein $\theta_{ji} = \theta_j - \theta_i$ and wherein $\theta_i$ is a voltage angle at the sending bus and $\theta_j$ is a voltage angle at the receiving bus; and estimating a value of admittance of the transmission line, using the equation:

$$Y(estim) = \frac{\sum_{k=1}^{M} Y_k(new)}{M}$$

wherein each of said $Y_k(new)$ values is a previously calculated value of admittance; and estimating a value of resistance of the line, using the equation:

$$R_{ij}(estim) = \frac{\sum_{k=1}^{M} R_{ijk}(new)}{M}$$

wherein each of said $R_{ikj}(new)$ values is a previously calculated value of resistance; and estimating a value of reactance of the line, using the equation:

$$X_{ij}(estim) = \frac{\sum_{k=1}^{M} X_{ijk}(new)}{M}$$

wherein each of the $X_{ijk}(new)$ values is a previously calculated value of reactance; and calculating a sample standard deviation of the estimated resistance and a sample standard deviation of the estimated reactance; and if the sample standard deviation of the estimated resistance or the sample standard deviation of the estimated reactance is greater than a predetermined threshold, then the computer re-estimating the resistance and the reactance using a least square method.

The measurements may be filtered to remove unreliable data prior to determining the estimated reactance, the estimated resistance and the estimated admittance. The number of reliable sets of measurements may be greater than nine. The least square method used to obtain a least squares solution of said resistance and said reactance by said computer using the $Y_k(new)$ values, the $R_{ikj}(new)$ values and the $X_{ijk}(new)$ values may use the following equations:

$R_{ij} + cX_{ij} = d$ $R_{ij} + eX_{ij} = f$ wherein:

$$c = \frac{Q_{ij}^*}{P_{ij}}$$

$$d = \frac{-V_j^2 + V_i V_j \cos\theta_{ij}}{P_{ij}}$$

$$e = \frac{-P_{ij}}{Q_{ij}^*} \text{ and}$$

$$f = \frac{V_i V_j \sin\theta_{ij}}{Q_{ij}^*}$$

DESCRIPTION OF THE INVENTION

PMU devices are installed at two sides of a transmission line of which its parameters are to be estimated. The estimation includes two tasks:

(1) A measurement from a PMU may be invalid data. False data that is caused by failure or malfunction of PMUs or communication channels may or may not be recognized using features of PMU measurements. In particular, some errors that are only associated with accuracy of measurements cannot be identified by the PMU itself. Fortunately, the measured voltage and power flow phasors of a line must satisfy the relationship of line flow equation. This fact enables users to identify and filter out invalid measurements.

(2) The line (branch) parameters (i.e. resistance, reactance of lines and admittance representing reactive charging power) cannot be directly measured by a PMU. These parameters vary with environment and weather (such as temperature) conditions. Therefore it is necessary to perform a real time continuous estimation of line parameters in on-line power flow calculations.

Figure 1:
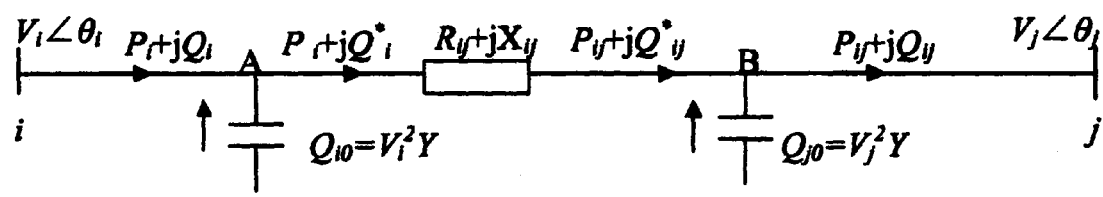
FIG. 1 is a one-line diagram of a typical transmission line i-j.

In the following discussion, the π equivalence of a line shown in FIG. 1 is used to explain the method. Generally, this equivalence is sufficient. It is not difficult to extend the concept to a multiple π equivalence circuit in the method if it is thought necessary in actual applications. Note that in this document, the unit of all quantities is in per unit system, all quantities related to real or reactive power refer to the total in three phases and voltage quantities to the line voltage.

As seen in FIG. 1, $R_{ij} + jX_{ij}$ is the line impedance. Y represents half of the grounding admittance corresponding to charging reactive power of the line. $V_i \angle \theta_i$ and $V_j \angle \theta_j$ are the voltage phasors at the sending and receiving buses. $P_i + jQ_i$ and $P_i + jQ^*_i$ are the line power flows respectively before and after the charging reactive power at the sending bus i. $P_{ij} + jQ^*_{ij}$ and $P_{ij} + jQ_{ij}$ are the line power flows before and after the charging reactive power at the receiving bus j. $Q_{i0}$ and $Q_{j0}$ represent the charging reactive powers at the sending and receiving ends respectively. In the real application, only $P_i$, $Q_i$, $P_i$ and $Q_{ij}$ are measurable through PMUs whereas $Q^*_i$ and $Q^*_{ij}$ can be calculated using $Q_i$ and $Q_{ij}$ and the charging reactive power. Note that the initial measurements are voltage and current phasors but these can be easily converted to line power flows. The charging reactive power occurs along the line but the total charging reactive power can be calculated by the difference between $Q_i$ and $Q_{ij}$ minus the reactive losses on the line.

The estimation of line parameters $R_{ij}$, $X_{ij}$ and Y for all lines whose parameters need to be estimated is performed at given time intervals (such as every 2-5 minutes or shorter). The PMUs can provide synchronized phasor data at a rate of about 10-30 samples per second or faster and therefore there is considerable sampling data available in the given interval. Note that the rate of waveform sampling can be up to 3000 or more samples per second. While the parameters of $R_{ij}$, $X_{ij}$ and Y may vary with the environment and weather conditions around the line in a relatively long period (such as more than half an hour), however, unlike the measurements of voltages and line (branch) power flows, the parameters are sufficiently stable (constant or a small change) in short intervals (for example a couple of minutes). Therefore, the parameters should be re-estimated at the given interval in a real time manner, whereas their stability in a very short time is used to filter invalid measurements.

Filtering Invalid Measurements

A number of sets of sampling data (measurements) are taken in the given interval. For each set of measurements, the following data filtering process is performed:

1. The $R_{ij}$, $X_{ij}$ and Y from the last estimation are used as a reference. Initial estimates of the parameters may be obtained using the prior art "one-snapshot" method.
2. The charging reactive powers are calculated by:

$$Q_{i0} = V_i^2 Y \quad (1)$$

$$Q_{j0} = V_j^2 Y \quad (2)$$

3. The equivalent reactive power flows on the line within the points A and B are calculated by:

$$Q_i^* = Q_i + Q_{i0} \quad (3)$$

$$Q_{ij}^* = Q_{ij} - Q_{jo} \quad (4)$$

4. The reactive loss on the line is estimated by:

$$\Delta Q_1 = \frac{X_{ij}(P_i^2 + (Q_i^*)^2)}{V_i^2} \quad (5)$$

$$\Delta Q_2 = \frac{X_{ij}(P_{ij}^2 + (Q_{ij}^*)^2)}{V_j^2} \quad (6)$$

$$\Delta Q = \frac{\Delta Q_1 + \Delta Q_2}{2} \quad (7)$$

The reactive loss is estimated from the two buses respectively and Equation (7) provides the average estimation from the two buses.

5. The parameter Y is updated using the measured reactive power flows at the two buses and the estimated line loss by:

$$Y(new) = \frac{Q_{ij} - Q_i + \Delta Q}{V_i^2 + V_j^2} \quad (8)$$

A threshold for filtering accuracy is specified. The threshold is based on the precision of PMU measurements, error transfer relationship between the measurements and Y, and possible small change of Y in the given short interval, which can be determined through testing and pre-estimation. For example, if 5% is used as the threshold, when Y(new) is larger than 1.05×Y(old) or smaller than 0.95×Y(old) where Y(old) refers to the value of Y in the last estimation, the whole set of measurements ($V_i$, $\theta_i$, $V_j$, $\theta_j$, $P_i$, $Q_i$, $P_{ij}$ and $Q_{ij}$) may be viewed as unreliable data and abandoned.

6. The equivalent charging reactive power at the receiving bus is updated by:

$$Q_{j0}(new) = V_j^2 Y(new) \quad (9)$$

7. The line reactive power on the line at the receiving end is updated by:

$$Q_{ij}^* = Q_{ij} - Q_{j0}(new) \quad (10)$$

8. The parameters $R_{ij}$ and $X_{ij}$ are estimated using the following line power flow equation based method.

The line power flow equation of $P_{ij} + jQ_{ij}^*$ can be expressed as:

$$P_{ij} + jQ_{ij}^* = V_j \angle \theta_j \left( \frac{V_i \angle \theta_i - V_j \angle \theta_j}{R_{ij} + jX_{ij}} \right)^{\oplus} \quad (11)$$

wherein the symbol $\oplus$ denotes the conjugate operation. Separating Equation (11) into the real and imaginary parts yields:

$$R_{ij}P_{ij} + X_{ij}Q_{ij}^* = -V_j^2 + V_i V_j \cos \theta_{ji} = a \quad (12)$$

$$R_{ij}Q_{ij}^* - X_{ij}P_{ij} = V_i V_j \sin \theta_{ji} = b \quad (13)$$

wherein $\theta_{ji} = \theta_j - \theta_i$.

It can be derived from Equations (12) and (13) that:

$$R_{ij}(new) = \frac{aP_{ij} + bQ_{ij}^*}{P_{ij}^2 + (Q_{ij}^*)^2} \quad (14)$$

$$X_{ij}(new) = \frac{aQ_{ij}^* - bP_{ij}}{P_{ij}^2 + (Q_{ij}^*)^2} \quad (15)$$

Similarly, a threshold for filtering accuracy is specified. The threshold is based on the precision of PMU measurements, error transfer relationship between the measurements and $R_{ij}$ or $X_{ij}$, and possible small change of $R_{ij}$ or $X_{ij}$ in the given short interval, which can be determined through testing and pre-estimation. For example, if 5% is used as the threshold, when either $R_{ij}$(new) is larger than 1.05×$R_{ij}$(old) or smaller than 0.95×$R_{ij}$(old), or $X_{ij}$(new) is larger than 1.05×$X_{ij}$(old) or smaller than 0.95×$X_{ij}$(old), this whole set of measurements ($V_i$, $\theta_i$, $V_j$, $\theta_j$, $P_i$, $Q_i$, $P_{ij}$ and $Q_{ij}$) may be viewed as unreliable data and abandoned.

If the number of reliable sets of measurement are smaller than a specified threshold (such as 10), more sampling data should be used until the specified threshold is met. If in a case, all sets of sampling data for a line in the given interval are filtered out as invalid data, a warning message should be sent to operators. Consecutive warning messages indicate that the PMU devices for that particular line may be in an abnormal situation.

Estimating $R_{ij}$, $X_{ij}$ and Y

Each of the estimated parameters in the above process is based on individual sampling data at a time point, and is used for the purpose of filtering invalid data. The parameters should be re-estimated using a group of reliable sets of sampling data to minimize errors. It is assumed that M reliable sets of measurements are obtained after the filtering process.

The parameter Y is re-estimated by the average of the M estimated Y values obtained using the M reliable sets of measurements in the filtering process:

$$Y(estim) = \frac{\sum_{k=1}^{M} Y_k(new)}{M} \quad (16)$$

wherein $Y_k$(new) is the value obtained using Equation (8) corresponding to the kth reliable set of measurements after filtering.

The parameters $R_{ij}$ and $X_{ij}$ are also re-estimated using the average of the M estimated $R_{ij}$ or $X_{ij}$ values, as applicable, obtained using the M reliable sets of measurements in the filtering process:

$$R_{ij}(estim) = \frac{\sum_{k=1}^{M} R_{ijk}(new)}{M} \quad (17)$$

$$X_{ij}(estim) = \frac{\sum_{k=1}^{M} X_{ijk}(new)}{M} \quad (18)$$

wherein $R_{ijk}(new)$ and $X_{ijk}(new)$ are, respectively, the values obtained using Equations (14) and (15) corresponding to the kth reliable set of measurements after filtering.

The standard deviations of $R_{ij}(estim)$ and $X_{ij}(estim)$ are calculated using the following equations:

$$R_{ij}(sd) = \sqrt{\frac{\sum_{k=1}^{M}[R_{ijk}(new) - R_{ij}(estim)]^2}{M-1}} \quad (19)$$

$$X_{ij}(sd) = \sqrt{\frac{\sum_{k=1}^{M}[X_{ijk}(new) - X_{ij}(estim)]^2}{M-1}} \quad (20)$$

If either $R_{ij}(sd)/R_{ij}(estim)$ or $X_{ij}(sd)/X_{ij}(estim)$ is larger than a threshold (expressed as a percentage), the estimated $R_{ij}$ and $X_{ij}$ obtained using Equations (17) and (18) are abandoned and the parameters $R_{ij}$ and $X_{ij}$ are re-estimated using the following method. This threshold is generally selected as half of the threshold for filtering accuracy (see step 8 above).

Equations (12) and (13) are re-written as:

$$R_{ij} + cX_{ij} = d \quad (21)$$

$$R_{ij} + eX_{ij} = f \quad (22)$$

wherein:

$$c = \frac{Q_{ij}^*}{P_{ij}} \quad (23)$$

$$d = \frac{-V_j^2 + V_i V_j \cos\theta_{ij}}{P_{ij}} \quad (24)$$

$$e = \frac{-P_{ij}}{Q_{ij}^*} \quad (25)$$

$$f = \frac{V_i V_j \sin\theta_{ij}}{Q_{ij}^*} \quad (26)$$

Applying the least square method to Equation (21) with the M sets of reliable measurements, results in:

$$R_{ij1}(estim) = \overline{d} - \overline{c} X_{ij1}(estim) \quad (27)$$

$$X_{ij1}(estim) = \frac{S_{cd}}{S_{cc}} \quad (28)$$

wherein:

$$\overline{d} = \frac{\sum_{k=1}^{M} d_k}{M} \quad (29)$$

$$\overline{c} = \frac{\sum_{k=1}^{M} c_k}{M} \quad (30)$$

$$S_{cd} = \sum_{k=1}^{M} (c_k - \overline{c})(d_k - \overline{d}) \quad (31)$$

$$S_{cc} = \sum_{k=1}^{M} (c_k - \overline{c})^2 \quad (32)$$

Similarly, applying the least square method to Equation (22) with the M sets of reliable measurements results in:

$$R_{ij2}(estim) = \overline{f} - \overline{e} X_{ij2}(estim) \quad (33)$$

$$X_{ij2}(estim) = \frac{W_{ef}}{W_{ee}} \quad (34)$$

wherein:

$$\overline{f} = \frac{\sum_{k=1}^{M} f_k}{M} \quad (35)$$

$$\overline{e} = \frac{\sum_{k=1}^{M} e_k}{M} \quad (36)$$

$$W_{ef} = \sum_{k=1}^{M} (e_k - \overline{e})(f_k - \overline{f}) \quad (37)$$

$$W_{ee} = \sum_{k=1}^{M} (e_k - \overline{e})^2 \quad (38)$$

The subscript k indicates the value corresponding to the kth reliable set of measurements after filtering.

The $R_{ij}$ and $X_{ij}$ are estimated using:

$$R_{ij}(estim) = \frac{R_{ij1}(estim) + R_{ij2}(estim)}{2} \quad (39)$$

$$X_{ij}(estim) = \frac{X_{ij1}(estim) + X_{ij2}(estim)}{2} \quad (40)$$

In a high voltage transmission system, $R_{ij}$ is much smaller than $X_{ij}$, and $P_{ij}$ is generally much larger than $Q^*_{ij}$. It is possible that in numerical calculations, Equation (21) is more accurate than Equation (22) for estimation of $R_{ij}$ and Equation (22) is more accurate than Equation (21) for estimation of $X_{ij}$. An alternative approach in an actual application is to use both Equations (21) and (22) first as described above. Then, if the difference between $R_{ij1}(estim)$ and $R_{ij2}(estim)$, or between $X_{ij1}$(estim) and $X_{ij2}$(estim), exceeds a threshold (in a relative percentage), only $R_{ij1}$(estim) and $X_{ij2}$(estim) are used as the final estimates.

The derivation above is based on the fact that three phases in a transmission system are symmetrical and therefore a single phase model is used in power flow calculation modeling. Similar to SCADA measurements, PMU devices provides separate measurements of phases A, B and C, which may have slight differences among them. The total real and reactive power flows of the three phases can be obtained by summing up the power flows that are calculated from measured voltage and current phasors of three individual phases. For voltage phasors, which are required in the calculations, the following two approaches can be used:

(1) The average of the measured voltage magnitudes or angles of phases A, B and C is used or the measured voltage magnitude and angle of one selected phase with the best measurement precision (such as phase A) is used. This is the traditional method used in the existing EMS.

(2) The voltage phasors of phases A, B and C and the total three phase power flows are used to estimate three sets of line parameters. The final parameter estimate is the average of the three estimates using the voltage phasors of phases A, B and C.

Simulation Results

The method according to the invention was tested using system power flow studies. Voltages (magnitudes and angles) and line power flows (real and reactive power flows) obtained from a number of power flow calculations were viewed as "measurements". The tests were conducted on IEEE test systems and the utility system operated and planned by the British Columbia Transmission Corporation in Canada. In some cases, errors were intentionally introduced to the voltage (either magnitude or angle) or line current (either magnitude or angle). The error of a voltage measurement impacts both voltage itself and line power flow, and the error of a current measurement only impacts the line power flow. The results showed that if no error is introduced, the estimated parameters were the same as those specified in the power flow calculations. In cases where some errors are introduced, the "measurements" with relatively large errors are filtered out and the estimated parameters, with a few unfiltered small measurement errors, are still the same as those specified in the power flow calculations.

Two examples are given below to demonstrate the feasibility and effectiveness of the presented method.

A. IEEE 118 Bus System

The IEEE 118 bus system is one of the test systems developed by IEEE PES for various testing purposes The data and original single-line diagram of this system is available at the web site http://www.ee.washington.edu/researchlpstcal, and which is hereby incorporated by reference. The system has 118 buses, 177 lines and 9 transformer branches. Bus voltage phasors and line power flows obtained via a considerable number of power flows were used as measurements to estimate the line parameters. Table 1 presents 30 sets of sampling measurements (voltage phasors and line power flows) of the line between Bus 42 and 49. Table 2 shows the estimates of resistance, reactance and grounding admittance parameters of the line obtained using each set of the measurements without any error introduced. Table 3 shows the first eight (8) measurements with intentionally introduced errors, and Table 4 shows the estimated parameters obtained using each of the eight "polluted" measurements. Five percent (5%) was used as the threshold for filtering accuracy. It is seen that four sets of measurements with relatively large errors for parameter estimation (two for resistance and two for grounding admittance) were filtered out. Table 5 shows the original and final estimated parameters of the line. It is observable that the estimated parameters, with other four acceptable measurement errors, are still the same as those without measurement error and the original parameters.

TABLE 1

Voltage phasors and power flows of line between bus 42 and 49 (Used as measurements)

| $V_i$ (p.u.) | $V\text{-}\theta_i$ (degree) | $V_j$ (p.u.) | $V\text{-}\theta_j$ (degree) | $P_i$ (p.u.) | $Q_i$ (p.u.) | $P_{ij}$ (p.u.) | $Q_{ij}$ (p.u.) |
|---|---|---|---|---|---|---|---|
| 1.02500 | −9.16450 | 0.92095 | −21.60700 | 0.68445 | 0.20213 | 0.64841 | 0.12095 |
| 1.02500 | −9.18850 | 0.92048 | −21.66400 | 0.68607 | 0.20361 | 0.64983 | 0.12149 |
| 1.02500 | −9.21260 | 0.92000 | −21.72100 | 0.68769 | 0.20510 | 0.65125 | 0.12202 |
| 1.02500 | −9.23670 | 0.91952 | −21.77700 | 0.68932 | 0.20659 | 0.65267 | 0.12256 |
| 1.02500 | −9.26080 | 0.91903 | −21.83400 | 0.69094 | 0.20809 | 0.65409 | 0.12309 |
| 1.02500 | −9.28500 | 0.91855 | −21.89100 | 0.69257 | 0.20959 | 0.65551 | 0.12363 |
| 1.02500 | −9.30920 | 0.91807 | −21.94800 | 0.69420 | 0.21109 | 0.65693 | 0.12416 |
| 1.02500 | −9.33340 | 0.91758 | −22.00500 | 0.69583 | 0.21260 | 0.65836 | 0.12470 |
| 1.02500 | −9.35770 | 0.91709 | −22.06300 | 0.69746 | 0.21411 | 0.65978 | 0.12524 |
| 1.02500 | −9.38200 | 0.91661 | −22.12000 | 0.69909 | 0.21563 | 0.66120 | 0.12577 |
| 1.02500 | −9.40640 | 0.91612 | −22.17800 | 0.70073 | 0.21716 | 0.66263 | 0.12631 |
| 1.02500 | −9.43080 | 0.91563 | −22.23500 | 0.70236 | 0.21868 | 0.66405 | 0.12685 |
| 1.02500 | −9.45520 | 0.91513 | −22.29300 | 0.70400 | 0.22022 | 0.66548 | 0.12738 |
| 1.02500 | −9.48030 | 0.91462 | −22.35300 | 0.70571 | 0.22183 | 0.66697 | 0.12795 |
| 1.02500 | −9.50480 | 0.91412 | −22.41100 | 0.70735 | 0.22337 | 0.66839 | 0.12849 |
| 1.02500 | −9.52940 | 0.91363 | −22.46900 | 0.70899 | 0.22492 | 0.66982 | 0.12902 |
| 1.02500 | −9.55390 | 0.91313 | −22.52700 | 0.71064 | 0.22647 | 0.67125 | 0.12956 |
| 1.02500 | −9.57850 | 0.91263 | −22.58500 | 0.71229 | 0.22803 | 0.67268 | 0.13010 |
| 1.02500 | −9.60320 | 0.91213 | −22.64300 | 0.71393 | 0.22959 | 0.67411 | 0.13063 |
| 1.02500 | −9.62790 | 0.91163 | −22.70200 | 0.71558 | 0.23116 | 0.67554 | 0.13117 |
| 1.02500 | −9.65260 | 0.91113 | −22.76000 | 0.71724 | 0.23273 | 0.67697 | 0.13171 |
| 1.02500 | −9.67730 | 0.91063 | −22.81900 | 0.71889 | 0.23431 | 0.67840 | 0.13225 |
| 1.02500 | −9.70210 | 0.91013 | −22.87800 | 0.72054 | 0.23589 | 0.67983 | 0.13278 |
| 1.02500 | −9.72690 | 0.90962 | −22.93700 | 0.72220 | 0.23747 | 0.68127 | 0.13332 |
| 1.02500 | −9.75180 | 0.90911 | −22.99600 | 0.72386 | 0.23907 | 0.68270 | 0.13386 |
| 1.02500 | −9.77670 | 0.90861 | −23.05500 | 0.72552 | 0.24066 | 0.68414 | 0.13439 |

TABLE 1-continued

Voltage phasors and power flows of line between bus 42 and 49
(Used as measurements)

| $V_i$ (p.u.) | $V\text{-}\theta_i$ (degree) | $V_j$ (p.u.) | $V\text{-}\theta_j$ (degree) | $P_i$ (p.u.) | $Q_i$ (p.u.) | $P_{ij}$ (p.u.) | $Q_{ij}$ (p.u.) |
|---|---|---|---|---|---|---|---|
| 1.02500 | −9.80160 | 0.90810 | −23.11400 | 0.72718 | 0.24226 | 0.68557 | 0.13493 |
| 1.02500 | −9.82660 | 0.90759 | −23.17300 | 0.72884 | 0.24387 | 0.68701 | 0.13547 |
| 1.02500 | −9.85160 | 0.90707 | −23.23300 | 0.73051 | 0.24548 | 0.68844 | 0.13601 |
| 1.02500 | −9.87670 | 0.90656 | −23.29200 | 0.73218 | 0.24710 | 0.68988 | 0.13655 |

Note:

$V_i$, $V\text{-}\theta_i$, $V_j$ and $V\text{-}\theta_j$ are voltage magnitudes and angles at the two buses of the line.

$P_i$, $Q_i$, $P_{ij}$ and $Q_{ij}$ are real and reactive line power flows at the two ends of the line.

TABLE 2

Estimated parameters using each set of measurements
(No error introduced into measurements)

| Resistance $R_{ij}$ (p.u.) | Reactance $X_{ij}$ (p.u.) | Grounding admittance Y (p.u.) |
|---|---|---|
| 7.150819053923806E−002 | 0.322989968322601 | 4.300220526445065E−002 |
| 7.149330580993267E−002 | 0.323002038639029 | 4.300189766289475E−002 |
| 7.149046946189627E−002 | 0.323009052958054 | 4.299980527569113E−002 |
| 7.149658150866126E−002 | 0.322991396789738 | 4.300055100092178E−002 |
| 7.150472406138476E−002 | 0.322994653692808 | 4.299844120684803E−002 |
| 7.150059309021398E−002 | 0.322996113504715 | 4.299835133317951E−002 |
| 7.149665765565506E−002 | 0.322996425440579 | 4.299946261069169E−002 |
| 7.150359595814752E−002 | 0.322989108633325 | 4.300074690170377E−002 |
| 7.150254278137581E−002 | 0.323006488974226 | 4.300247211567151E−002 |
| 7.149489823420041E−002 | 0.323001470408724 | 4.299968940946629E−002 |
| 7.149109097810898E−002 | 0.323009477800442 | 4.299772505322701E−002 |
| 7.149717020207620E−002 | 0.322998254754971 | 4.299993083454870E−002 |
| 7.150410198175207E−002 | 0.323002420925849 | 4.299814438170383E−002 |
| 7.149390637544904E−002 | 0.323005200606151 | 4.300047376549218E−002 |
| 7.150129364038653E−002 | 0.323009639489799 | 4.300105320744722E−002 |
| 7.149477925376078E−002 | 0.323007578406282 | 4.299851336355507E−002 |
| 7.150033822538918E−002 | 0.323004930334097 | 4.300097996821717E−002 |
| 7.150467579167154E−002 | 0.322999056323605 | 4.300044095865730E−002 |
| 7.150930537175613E−002 | 0.322989863806196 | 4.300059970852191E−002 |
| 7.150400649437677E−002 | 0.323001968416419 | 4.299837632850823E−002 |
| 7.150718318722206E−002 | 0.322990614500469 | 4.300030297576305E−002 |
| 7.149952006321696E−002 | 0.323000498258261 | 4.299752789907323E−002 |
| 7.149265451649425E−002 | 0.323006951425721 | 4.299663995904027E−002 |
| 7.149865954872979E−002 | 0.323005662316445 | 4.300231080932703E−002 |
| 7.150161838879489E−002 | 0.323006100812629 | 4.299821434436004E−002 |
| 7.149388892505171E−002 | 0.323002116530079 | 4.300135676163106E−002 |
| 7.149668413889657E−002 | 0.323000221611103 | 4.300111705480244E−002 |
| 7.149830074128569E−002 | 0.322990356245569 | 4.299994611080062E−002 |
| 7.150330688094943E−002 | 0.323004133163954 | 4.300314836950893E−002 |
| 7.150367321102724E−002 | 0.322989930110879 | 4.300335400354474E−002 |

TABLE 3

First 8 sets of measurements with introduced errors

| $V_i$ (p.u.) | $V\text{-}\theta_i$ (degree) | $V_j$ (p.u.) | $V\text{-}\theta_j$ (degree) | $P_i$ (p.u.) | $Q_i$ (p.u.) | $P_{ij}$ (p.u.) | $Q_{ij}$ (p.u.) | Error source |
|---|---|---|---|---|---|---|---|---|
| *1.03525 | −9.16450 | 0.92095 | −21.60700 | *0.69129 | *0.20415 | 0.64841 | 0.12095 | 1% error on $V_i$ |
| 1.02500 | *−9.37230 | 0.92048 | −21.66400 | *0.68672 | *0.20141 | 0.64983 | 0.12149 | 2% error on $V\text{-}\theta_i$ |
| 1.02500 | −9.21260 | *0.93840 | −21.72100 | 0.68769 | 0.20510 | *0.66428 | *0.12446 | 2% error on $V_j$ |
| 1.02500 | −9.23670 | 0.91952 | *−21.99500 | 0.68932 | 0.20659 | *0.65313 | *0.12008 | 1% error on $V\text{-}\theta_j$ |
| 1.02500 | −9.26080 | 0.91903 | −21.83400 | *0.69785 | *0.21017 | 0.65409 | 0.12309 | 1% error on $I_i$ |
| 1.02500 | −9.28500 | 0.91855 | −21.89100 | *0.69063 | *0.21590 | 0.65551 | 0.12363 | 2% error on $I\text{-}\theta_i$ |

TABLE 3-continued

First 8 sets of measurements with introduced errors

| $V_i$ (p.u.) | $V\text{-}\theta_i$ (degree) | $V_j$ (p.u.) | $V\text{-}\theta_j$ (degree) | $P_i$ (p.u.) | $Q_i$ (p.u.) | $P_{ij}$ (p.u.) | $Q_{ij}$ (p.u.) | Error source |
|---|---|---|---|---|---|---|---|---|
| 1.02500 | −9.30920 | 0.91807 | −21.94800 | 0.69420 | 0.21109 | *0.67007 | 0.12665 | 2% error on $I_j$ |
| 1.02500 | −9.33340 | 0.91758 | −22.00500 | 0.69583 | 0.21260 | *0.65764 | 0.12846 | 1% error on $I\text{-}\theta_j$ |

Note:
1) $I_i$, $I\text{-}\theta_i$, $I_j$ and $I\text{-}\theta_j$ are current magnitudes and angles at the two buses of the line. $V_i$, $V\text{-}\theta_i$, $V_j$ and $V\text{-}\theta_j$ are voltage magnitudes and angles at the two buses of the line. $P_i$, $Q_i$, $P_{ij}$ and $Q_{ij}$ are real and reactive line power flows at the two ends of the line.
2) The measurements with errors are prefixed by *.
3) An error in the measurement of voltage magnitude or angle has impacts not only on itself but also on real and reactive line powers whereas an error in the measurement of current magnitude or angle has impacts only on real and reactive line powers.

TABLE 4

Estimated parameters using each of the first 8 sets of measurements with errors
(Errors introduced on voltage or current phasors at two buses)

| Resistance $R_{ij}$ (p.u.) | Reactance $X_{ij}$ (p.u.) | Grounding admittance Y (p.u.) | Error source | Note |
|---|---|---|---|---|
| 8.442778000797151E−002 | 0.327976565022061 | 4.149395128849082E−002 | 1% error on $V_i$ | filtered |
| 7.354215645412961E−002 | 0.318611262005352 | 4.414604437753773E−002 | 2% error on $V\text{-}\theta_i$ | unfiltered |
| 4.650541001052875E−002 | 0.319639262614001 | 4.349025118816752E−002 | 2% error on $V_j$ | filtered |
| 7.030523456060858E−002 | 0.327814339269931 | 4.170960516485524E−002 | 1% error on $V\text{-}\theta_j$ | unfiltered |
| 7.140607804964676E−002 | 0.323003125655167 | 4.276462519717335E−002 | 1% error on $I_i$ | unfiltered |
| 7.012042547553828E−002 | 0.323108469786721 | 3.971573441817353E−002 | 2% error on $I\text{-}\theta_i$ | filtered |
| 7.100579512324626E−002 | 0.316582486741477 | 4.612013643859956E−002 | 2% error on $I_j$ | filtered |
| 7.048479944309825E−002 | 0.323431732936217 | 4.495975726943799E−002 | 1% error on $I\text{-}\theta_j$ | unfiltered |

Note:
"filtered" indicating that the set of measurements is filtered by the given threshold and "unfiltered" indicating that the errors in the estimated parameters caused by the measurement errors are within the threshold and acceptable.

TABLE 5

Original and estimated line parameters

| | Original | Estimated (No measurement error) | Estimated (Measurement errors filtered) |
|---|---|---|---|
| Resistance $R_{ij}$ (p.u) | 0.0715 | 0.07150 | 0.07149 |
| Reactance $X_{ij}$ (p.u) | 0.3230 | 0.32300 | 0.32303 |
| Grounding Admittance Y (p.u) | 0.0430 | 0.04300 | 0.04306 |

B. BCTC System

Figure 2:
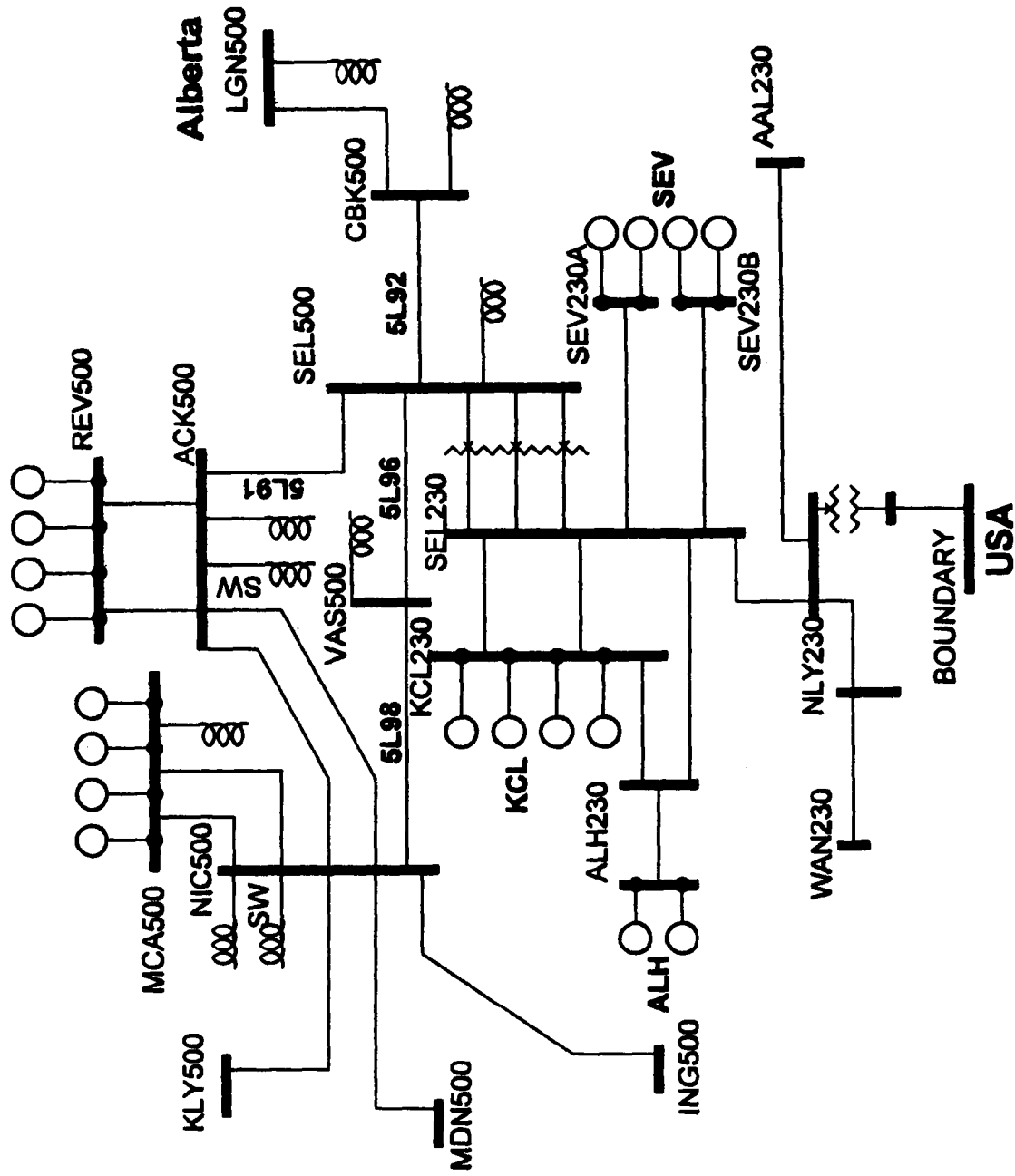
FIG. 2 is a representation of a portion of the British Columbia Transmission Corporation system.

The system power flow case used in testing had 15,161 buses and 19,403 branches, including the partial system model of the west USA network. FIG. 2 shows a partial representation of the system. General information and some particulars of the BCTC system are available at http://www.bctc.com/the_transmission_system, which is hereby incorporated by reference. Similarly, bus voltage phasors and line power flows obtained in power flow calculations were used as measurements to estimate the line parameters. The line whose parameters were estimated is a 500 kV overhead line named line 5L96. The system power flow states considered had a wide range, including normal states to outage states that create heavy loading levels on line 5L96 causing it come close to voltage instability. Any change in the system operation state should not have had any impact on the line parameters even if the system state approached the voltage collapse point. Table 6 shows ten sets of sampling measurements on line 5L96 (voltage phasors and line power flows), and Table 7 shows the estimates of resistance, reactance and grounding admittance parameters of the line using each set of the measurements. Table 8 shows the original and final estimated parameters of the line 5 L96.

TABLE 6

Voltage phasors and power flows of Line 5L96
(Used as measurements)

| $V_i$ (p.u.) | $V\text{-}\theta_i$ (degree) | $V_j$ (p.u.) | $V\text{-}\theta_j$ (degree) | $P_i$ (p.u.) | $Q_i$ (p.u.) | $P_{ij}$ (p.u.) | $Q_{ij}$ (p.u.) |
|---|---|---|---|---|---|---|---|
| 1.07000 | 8.60000 | 1.08400 | 1.50000 | 6.57000 | −1.90700 | 6.51000 | −0.39500 |
| 1.06000 | 10.40000 | 1.07500 | 2.30000 | 7.38000 | −1.86900 | 7.30000 | −0.62900 |
| 1.04800 | 13.40000 | 1.06300 | 3.70000 | 8.65000 | −1.70500 | 8.55000 | −0.93500 |
| 1.04200 | 15.50000 | 1.05500 | 4.70000 | 9.56000 | −1.47800 | 9.44000 | −1.08000 |
| 1.03600 | 17.60000 | 1.04600 | 5.60000 | 10.47000 | −1.22400 | 10.31000 | −1.24000 |
| 0.97400 | 35.40000 | 0.95000 | 10.50000 | 18.39000 | 2.82700 | 17.82000 | −3.31000 |

TABLE 6-continued

Voltage phasors and power flows of Line 5L96
(Used as measurements)

| $V_i$ (p.u.) | V-$\theta_i$ (degree) | $V_j$ (p.u.) | V-$\theta_j$ (degree) | $P_i$ (p.u.) | $Q_i$ (p.u.) | $P_{ij}$ (p.u.) | $Q_{ij}$ (p.u.) |
|---|---|---|---|---|---|---|---|
| 0.94300 | 38.50000 | 0.92100 | 11.20000 | 18.79000 | 3.25000 | 18.16000 | −3.97000 |
| 0.93400 | 39.40000 | 0.91300 | 11.50000 | 18.83000 | 3.32000 | 18.18000 | −4.14000 |
| 0.92300 | 40.40000 | 0.90300 | 11.80000 | 18.86000 | 3.40000 | 18.19000 | −4.37000 |
| 0.90400 | 42.00000 | 0.88700 | 12.10000 | 18.87000 | 3.63000 | 18.17000 | −4.74000 |

TABLE 7

Estimated parameters using each set of measurements
(No error introduced into measurements)

| Resistance $R_{ij}$ (p.u.) | Reactance $X_{ij}$ (p.u.) | Grounding admittance Y (p.u.) |
|---|---|---|
| 1.548079448990775E−003 | 2.164686703340432E−002 | 1.00634041480235 |
| 1.540257804047732E−003 | 2.161604192015683E−002 | 1.00642302851147 |
| 1.507477920127257E−003 | 2.158783668403971E−002 | 1.00748042825992 |
| 1.491795456659398E−003 | 2.147316672004808E−002 | 1.00745808660354 |
| 1.573061016193664E−003 | 2.149563310309445E−002 | 1.00788947177925 |
| 1.543499388548838E−003 | 2.149672277048962E−002 | 1.00839028571578 |
| 1.507889329436661E−003 | 2.153452780650219E−002 | 1.00544332987656 |
| 1.505684381083002E−003 | 2.153580979630141E−002 | 1.01163590422382 |
| 1.537998257741009E−003 | 2.149474573088756E−002 | 1.00884387956467 |
| 1.465168579534557E−003 | 2.155604011536260E−002 | 0.94910943742322 |

TABLE 8

Original and estimated parameters of 5L96

| | Original | Estimated |
|---|---|---|
| Resistance $R_{ij}$ (p.u) | 0.00153 | 0.00152 |
| Reactance $X_{ij}$ (p.u) | 0.02154 | 0.02154 |
| Grounding Admittance Y (p.u) | 1.00701 | 1.00190 |

The calculations performed in the above described system and method can be implemented as a series of instructions stored on computer readable memory within a computer, such as within RAM, or on computer readable storage medium. The method and system may be expressed as a series of instructions present in a carrier wave embodying a computer data signal to communicate the instructions to a networked device or server, which when executed by a processor within the computer, carry out the method.

Although the particular preferred embodiments of the invention have been disclosed in detail for illustrative purposes, it will be recognized that variations or modifications of the disclosed apparatus lie within the scope of the present invention.

We claim:

1. A method of filtering invalid measurements, comprising the steps of:
    (a) receiving measurements from a first phasor measurement unit at a sending bus i of a transmission line, and a second phasor measurement unit at a receiving bus j of said transmission line;
    (b) calculating charging reactive powers at said sending bus and said receiving bus; a reactive power flow excluding charging reactive power at said sending bus, a reactive power flow excluding charging reactive power at said receiving bus, and a reactive power loss of said line, using said measurements;
    (c) calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at said sending bus, $V_j$ is a voltage magnitude at said receiving bus, $Q_i$ is a reactive power flow including charging reactive power at said sending bus, and $Q_{ij}$ is a reactive power flow including charging reactive power at said receiving bus; and $\Delta Q$ is a power loss of said transmission line;
    (d) using said grounding admittance Y(new) to recalculate said charging reactive power at said receiving bus, and said reactive power flow excluding charging reactive power at said receiving bus;
    (e) calculating a resistance $R_{ij}$ and a reactance $X_{ij}$ using the following equation:

$$R_{ij}(new) = \frac{aP_{ij} + bQ_{ij}^*}{P_{ij}^2 + (Q_{ij}^*)^2} \text{ and } X_{ij}(new) = \frac{aQ_{ij}^* - bP_{ij}}{P_{ij}^2 + (Q_{ij}^*)^2}$$

wherein $P_{ij}$ is a real power flow at said receiving bus, $Q^*_{ij}$ is a reactive power flow excluding said charging reactive power at said receiving bus; and a and b are calculated using the following equations:

$$-V_j^2 + V_i V_j \cos \theta_{ji} = a$$

$$V_i V_j \sin \theta_{ji} = b$$

wherein $\theta_{ji} = \theta_j - \theta_i$ wherein $\theta_i$ is a voltage angle at said sending bus and $\theta_j$ is a voltage angle at said receiving bus.

2. The method of claim 1 further comprising:
calculating an error for each of said resistance, said reactance and said grounding admittance, and if said error for either said resistance, or said reactance or said grounding admittance, is larger than a predetermined threshold, discarding said measurements.

3. The method of claim 1 wherein said measurements from said first and second phasor measurement units include said voltage magnitude $V_i$ at said sending bus, said voltage magnitude $V_j$ at said receiving bus, said voltage angle $\theta_i$ at said sending bus and said voltage angle $\theta_j$ at said receiving bus; a line power flow $P_{ij}+jQ_{ij}$ including a charging reactive power at said receiving bus; and a line power flow $P_i+jQ_i$ including a charging reactive power at said sending bus.

4. The method of claim 2 wherein said threshold is determined using a precision factor associated with said measurements, an error transfer relationship factor between said measurements and said resistance, said reactance and said grounding admittance, and an estimate of possible small change of said resistance, said reactance and said grounding admittance in a short time interval.

5. A system for filtering invalid measurements, comprising:
a) a first phasor measurement unit at a sending bus i of a transmission line and a second phasor measurement unit at a receiving bus j of said transmission line, said first and second phasor measurement units providing measurements associated with a transmission line;
b) a computer, said computer calculating: charging reactive powers at said sending bus and said receiving bus; a reactive power flow excluding charging reactive power at said sending bus, a reactive power flow excluding charging reactive power at said receiving bus, and a reactive power loss of said line using said measurements;

and calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at said sending bus, $V_j$ is a voltage magnitude at said receiving bus, $Q_i$, is a reactive power flow including charging reactive power at said sending bus, and $Q_{ij}$ is a reactive power flow including charging reactive power at said receiving bus; and $\Delta Q$ is a loss of power of said transmission line;

and using said grounding admittance Y(new) to recalculate said charging reactive power at said receiving bus, and said reactive power flow excluding charging reactive power at said receiving bus;

and calculating a resistance $R_{ij}$ and a reactance $X_{ij}$ using the following equation:

$$R_{ij}(new) = \frac{aP_{ij} + bQ_{ij}^*}{P_{ij}^2 + (Q_{ij}^*)^2} \text{ and } X_{ij}(new) = \frac{aQ_{ij}^* - bP_{ij}}{P_{ij}^2 + (Q_{ij}^*)^2}$$

wherein $P_{ij}$ is a real power flow at said receiving bus, $Q^*_{ij}$ is a reactive power flow excluding said charging reactive power at said receiving bus; and a and b are calculated using the equations:

$-V_j^2 + V_i V_j \cos\theta_{ji} = a$ and $V_i V_j \sin\theta_{ji} = b$ wherein $\theta_{ji} = \theta_j - \theta_i$ wherein $\theta_i$ is a voltage angle at said sending bus and $\theta_j$ is a voltage angle at said receiving bus.

6. The system of claim 5 wherein said computer further calculates an error for each of said resistance, said reactance and said grounding admittance, and if said error for either said resistance, or said reactance or said grounding admittance is larger than a predetermined threshold, said computer discards said measurements.

7. The system of claim 5 wherein said measurements from said first and second phasor measurement units include said voltage magnitude $V_i$ at said sending bus, said voltage magnitude $V_j$ at said receiving bus, said voltage angle $\theta_i$ at said sending bus and said voltage angle $\theta_j$ at said receiving bus; a line power flow $P_{ij}+jQ_{ij}$ including a charging reactive power at said receiving bus; and a line power flow $P_i+jQ_i$, including a charging reactive power at said sending bus.

8. The system of claim 6 wherein said computer calculates said threshold using a precision factor associated with said measurements, an error transfer relationship factor between said measurements and said resistance, said reactance and said grounding admittance, and an estimate of possible small change of said resistance, said reactance and said grounding admittance in a short time interval.

9. A method of estimating line parameters using first and second phasor measurement units associated with a transmission line, comprising the steps of
(a) obtaining a plurality (M) sets of measurements from said phasor measurement units;
(b) for each of said sets of measurements, calculating charging reactive powers at a sending bus i and a receiving bus j of said transmission line; a reactive power flow excluding charging reactive power at said sending bus, a reactive power flow excluding charging reactive power at said receiving bus of said line, and a reactive power loss of said line, using said measurements;

and calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at said sending bus, $V_j$ is a voltage magnitude at said receiving bus, $Q_i$, is a reactive power flow including charging reactive power at said sending bus, and $Q_{ij}$ is a reactive power flow including charging reactive power at said receiving bus; and $\Delta Q$ is a loss of said transmission line;

and using said grounding admittance Y(new) to recalculate said charging reactive power at said receiving bus, and said reactive power flow excluding charging reactive power at said receiving bus;

and calculating a resistance $R_{ij}$ and a reactance $X_{ij}$ using the following equation:

$$R_{ij}(new) = \frac{aP_{ij} + bQ_{ij}^*}{P_{ij}^2 + (Q_{ij}^*)^2} \text{ and } X_{ij}(new) = \frac{aQ_{ij}^* - bP_{ij}}{P_{ij}^2 + (Q_{ij}^*)^2}$$

wherein $P_{ij}$ is a real power flow at said receiving bus, $Q^*_{ij}$ is a reactive power flow excluding said charging reactive power at said receiving bus; and a and b are calculated using the following equations:

$-V_j^2 + V_i V_j \cos\theta_{ji} = a$ $V_i V_j \sin\theta_{ji} = b$ wherein $\theta_{ji}=\theta_j-\theta_i$ wherein $\theta_i$ is a voltage angle at said sending bus and $\theta_j$ is a voltage angle at said receiving bus;

(c) estimating a value of grounding admittance of said transmission line, using the equation:

$$Y(estim) = \frac{\sum_{k=1}^{M} Y_k(new)}{M}$$

wherein each of said $Y_k(new)$ values is a previously calculated value of admittance;

(d) estimating a value of resistance of said line, using the equation:

$$R_{ij}(estim) = \frac{\sum_{k=1}^{M} R_{ijk}(new)}{M}$$

wherein each of said $R_{ikj}(new)$ values is a previously calculated value of resistance;

(e) estimating a value of reactance of said line, using the equation:

$$X_{ij}(estim) = \frac{\sum_{k=1}^{M} X_{ijk}(new)}{M}$$

wherein each of said $X_{ijk}(new)$ values is a previously calculated value of reactance;

(f) calculating a sample standard deviation of said estimated resistance and a sample standard deviation of said estimated reactance;

(g) if said sample standard deviation of said estimated resistance or said sample standard deviation of said estimated reactance is greater than a predetermined threshold, then said computer re-estimating said resistance and said reactance using a least square method.

10. The method of claim 9 wherein said measurements are filtered to remove unreliable data prior to determining said estimated reactance, said estimated resistance and said estimated admittance.

11. The method of claim 10 wherein said M is a number of reliable sets of measurements and is greater than nine.

12. The method of claim 11 wherein said least square method is used to obtain a least squares solution of said resistance and said reactance using said $Y_k(new)$ values, said $R_{ikj}(new)$ values and said $X_{ijk}(new)$ values and the following equations:

$$R_{ij}+cX_{ij}=d$$

$$R_{ij}+eX_{ij}=f$$

wherein:

$$c = \frac{Q_{ij}^*}{P_{ij}}$$

$$d = \frac{-V_j^2 + V_iV_j\cos\theta_{ij}}{P_{ij}}$$

-continued $$e = \frac{-P_{ij}}{Q_{ij}^*} \text{ and}$$

$$f = \frac{V_1 V_j \sin\theta_{ij}}{Q_{ij}^*}.$$

13. A system for estimating line parameters, comprising:
a) a transmission line;
b) first and second phasor measurement units associated with said transmission line;
c) a computer, said computer receiving a plurality (M) sets of measurements from said phasor measurement units; and calculating charging reactive powers at a sending bus i and a receiving bus j of said transmission line; a reactive power flow excluding charging reactive power at said sending bus, a reactive power flow excluding charging reactive power at said receiving bus, and a reactive power loss of said line, using said measurements;
and calculating a grounding admittance Y(new) using the following equation:

$$Y(new) = \frac{Q_{ij} - Q_i + \Delta Q}{V_i^2 + V_j^2}$$

wherein $V_i$ is a voltage magnitude at said sending bus, $V_j$ is a voltage magnitude at said receiving bus, $Q_i$, is a reactive power flow including charging reactive power at said sending bus, and $Q_{ij}$ is a reactive power flow including charging reactive power at said receiving bus; and $\Delta Q$ is a loss of said transmission line;

and using said grounding admittance Y(new) to recalculate said charging reactive power at said receiving bus, and said reactive power flow excluding charging reactive power at said receiving bus;

and calculating a resistance $R_{ij}$ and a reactance $X_{ij}$ using the following equation:

$$R_{ij}(new) = \frac{aP_{ij}+bQ_{ij}^*}{P_{ij}^2+(Q_{ij}^*)^2} \text{ and } X_{ij}(new) = \frac{aQ_{ij}^*-bP_{ij}}{P_{ij}^2+(Q_{ij}^*)^2}$$

wherein $P_{ij}$ is a real power flow at said receiving bus, $Q^*_{ij}$ is a reactive power flow excluding said charging reactive power at said receiving bus; and a and b are calculated using the following equations:

$$-V_j^2+V_iV_j\cos\theta_{ji}=a \text{ and}$$

$$V_iV_j\sin\theta_{ji}=b$$

wherein $\theta_{ji}=\theta_j-\theta_i$ and wherein $\theta_i$ is a voltage angle at said sending bus and $\theta_j$ is a voltage angle at said receiving bus;

and estimating a value of admittance of said transmission line, using the equation:

$$Y(estim) = \frac{\sum_{k=1}^{M} Y_k(new)}{M}$$

wherein each of said $Y_k(new)$ values is a previously calculated value of admittance;

and estimating a value of resistance of said line, using the equation:

$$R_{ij}(estim) = \frac{\sum_{k=1}^{M} R_{ijk}(new)}{M}$$

wherein each of said $R_{ikj}(new)$ values is a previously calculated value of resistance;

and estimating a value of reactance of said line, using the equation:

$$X_{ij}(estim) = \frac{\sum_{k=1}^{M} X_{ijk}(new)}{M}$$

wherein each of said $X_{ijk}(new)$ values is a previously calculated value of reactance;

and calculating a sample standard deviation of said estimated resistance and a sample standard deviation of said estimated reactance;

and if said sample standard deviation of said estimated resistance or said sample standard deviation of said estimated reactance is greater than a predetermined threshold, then said computer re-estimating said resistance and said reactance using a least square method.

14. The system of claim 13 wherein said measurements are filtered to remove unreliable data prior to determining said estimated reactance, said estimated resistance and said estimated admittance.

15. The system of claim 14 wherein said M is a number of reliable sets of measurements and is greater than nine.

16. The system of claim 14 wherein said least square method is used to obtain a least squares solution of said resistance and said reactance by said computer using said $Y_k(new)$ values, said $R_{ikj}(new)$ values and said $X_{ijk}(new)$ values and the following equations:

$$R_{ij} + cX_{ij} = d$$

$$R_{ij} + eX_{ij} = f$$

wherein:

$$c = \frac{Q_{ij}^*}{P_{ij}}$$

$$d = \frac{-V_j^2 + V_i V_j \cos\theta_{ij}}{P_{ij}}$$

$$e = \frac{-P_{ij}}{Q_{ij}^*} \text{ and}$$

$$f = \frac{V_i V_j \sin\theta_{ij}}{Q_{ij}^*}$$

* * * * *